(12) United States Patent
Kim

(10) Patent No.: US 10,388,359 B2
(45) Date of Patent: Aug. 20, 2019

(54) SEMICONDUCTOR DEVICE AND SEMICONDUCTOR SYSTEM USING THE SAME

(71) Applicant: SK hynix Inc., Icheon-si, Gyeonggi-do (KR)

(72) Inventor: Young Hoon Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 10 days.

(21) Appl. No.: 16/013,307

(22) Filed: Jun. 20, 2018

(65) Prior Publication Data
US 2019/0122719 A1 Apr. 25, 2019

(30) Foreign Application Priority Data
Oct. 19, 2017 (KR) .................. 10-2017-0135926

(51) Int. Cl.
*G11C 7/22* (2006.01)
*G11C 11/4076* (2006.01)

(52) U.S. Cl.
CPC .......... *G11C 11/4076* (2013.01); *G11C 7/222* (2013.01); *G11C 7/225* (2013.01)

(58) Field of Classification Search
CPC ...... G06F 1/00; G06F 1/04; G06F 1/06; G06F 1/10; G11C 11/00; G11C 11/4076; G11C 7/00; G11C 7/22; G11C 7/222; G11C 7/225; H03K 5/00; H03K 5/15013
USPC ........................................... 327/295
See application file for complete search history.

(56) References Cited

U.S. PATENT DOCUMENTS

2006/0268655 A1 * 11/2006 Lin .................. G11C 7/22
365/194

FOREIGN PATENT DOCUMENTS

KR 1020150033293 A 4/2015

* cited by examiner

*Primary Examiner* — Lincoln D Donovan
*Assistant Examiner* — Dave Mattison
(74) *Attorney, Agent, or Firm* — William Park & Associates Ltd.

(57) ABSTRACT

A semiconductor device may include a divider circuit and a detection circuit. The divider circuit may divide an external clock to generate a plurality of divided clocks. The detection circuit may generate a phase information signal and a timing information signal based on a plurality of data determination signals and the plurality of divided clocks.

18 Claims, 4 Drawing Sheets

SEMICONDUCTOR DEVICE AND SEMICONDUCTOR SYSTEM USING THE SAME

CROSS-REFERENCES TO RELATED APPLICATION

The present application claims priority under 35 U.S.C. § 119(a) to Korean application number 10-2017-0135926, filed on Oct. 19, 2017, in the Korean Intellectual Property Office, which is incorporated herein by reference in its entirety.

BACKGROUND

1. Technical Field

Various embodiments may generally relate to a semiconductor device and a semiconductor system using the same, and more particularly, to a semiconductor integrated circuit and a semiconductor system using the same.

2. Related Art

As semiconductor devices become faster, the importance of synchronizing signals grows. For example, an input or output signal may be synchronized to a full clock signal. However, to restore the full clock signal from divided clock signals in performing the synchronization, a clock chopper circuit is used. This can involve large clock buffers and increased power consumption.

SUMMARY

In accordance with an embodiment of the present disclosure, a semiconductor device may include a divider circuit and a detection circuit. The divider circuit may divide an external clock to generate a plurality of divided clocks. The detection circuit may generate, based on a control signal, a plurality of data determination signals, and the plurality of divided clocks, a phase information signal and a timing information signal.

In accordance with another embodiment of the present disclosure, a semiconductor device may include a divider circuit and a detection circuit. The divider circuit may divide an external clock to generate a first divided clock and a second divided clock. The detection circuit may generate, based on a control signal, a first data determination signal, a second data determination signal, the first divided clock, and the second divided clock, a phase information signal and a timing information signal. The first divided clock and the second divided clock may have a phase difference of substantially 90°. The first data determination signal and the second data determination signal may have substantially opposite phases.

In accordance with an additional embodiment of the present disclosure, a semiconductor system may include a controller and a semiconductor device. The controller may provide a data determination signal, a command, and an external clock. The semiconductor device may include a detection circuit. The detection circuit may compare a phase of the data determination signal with a phase of a divided clock based on a control signal to generate a phase information signal and/or compare the phase of the data determination signal with a phase of a write pulse in response to a control signal to generate a timing information signal.

BRIEF DESCRIPTION OF THE DRAWINGS

Aspects, features, and advantages of the subject matter of the present disclosure are described in detail with reference to the figures listed below.

DETAILED DESCRIPTION

Various embodiments of the present invention are described in detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes in accordance with the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a limited number of embodiments of the present teachings are shown and described, it will be appreciated by those of ordinary skill in the art that changes may be made in these embodiments without departing from the principles and spirit of the present invention. Example embodiments include a semiconductor device that may be capable of determining a synchronized timing of a signal with a clock and detecting phases of the clock and the signal.

Figure 1:
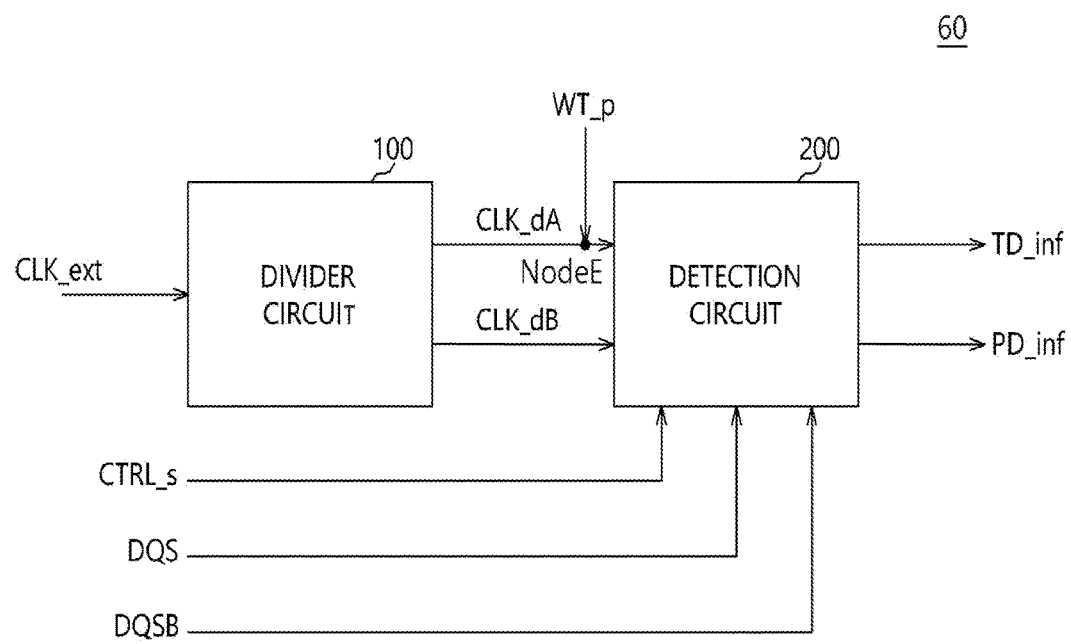
FIG. 1 shows a block diagram illustrating a semiconductor device in accordance with an embodiment of the present teachings.

FIG. 1 shows a block diagram illustrating a semiconductor device 60 in accordance with an embodiment of the present teachings.

Figure 5:
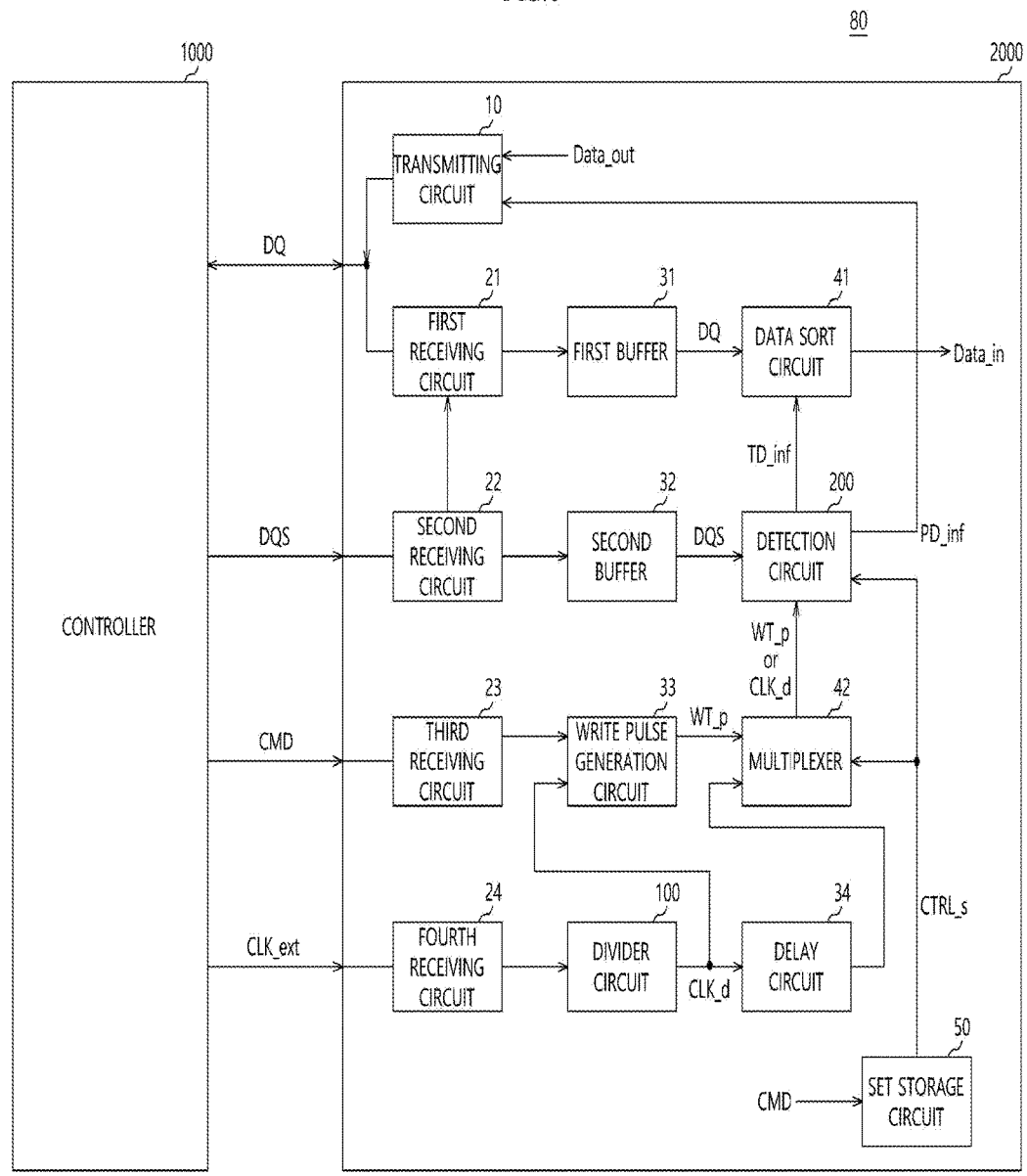
FIG. 5 shows a block diagram illustrating a semiconductor system including a semiconductor device in accordance with an embodiment of the present teachings.

Referring to FIG. 1, the semiconductor device may include a divider circuit 100 and a detection circuit 200. Additional components which may be included in the semiconductor device 60 consistent with an embodiment are shown in FIG. 5.

The divider circuit 100 may divide an external clock CLK_ext to generate a first divided clock CLK_dA and a second divided clock CLK_dB. The first divided clock CLK_dA and the second divided clock CLK_dB may have different phases. For an embodiment, a difference in phase between the first and second divided clocks CLK_dA and CLK_dB may be about 90 degrees (90°). As used herein with respect to some described embodiments, the term "external clock" refers to an external clock signal, and the term "divided clock" refers to a divided clock signal.

The detection circuit 200 may generate a timing information signal TD_inf and a phase information signal PD_inf based on the first divided clock CLK_dA, the second divided clock CLK_dB, a first data determination signal DQS, a second data determination signal DQSB, and a control signal CTRL_s. For example, when the control signal CTRL_s is enabled to a high level, the detection circuit 200 may compare the phases of the first and second divided clocks CLK_dA and CLK_dB with phases of the first and second data determination signals DQS and DQSB to output information, included in the phase information signal PD_inf, directed to whether the phases of the first and second divided clocks CLK_dA and CLK_dB may be faster or slower than the phases of the first and second data determination signals DQS and DQSB. When the control signal CTRL_s is disabled to a low level, the detection circuit 200 may compare the phases of the first and second divided clocks CLK_dA and CLK_dB with the phases of the first and second data determination signals DQS and DQSB to output information, included in the timing information signal TD_inf, directed to whether signals inputted into the semiconductor device may be synchronized with the first data determination signal DQS or the second data determination signal DQSB. The control signal CTRL_s may include an output signal from a mode register set for setting operational modes of the semiconductor device 60. The phase of the first data determination signal DQS may be opposite to the phase of the second data determination signal DQSB. The detection circuit 200 may receive a write pulse WT_p through a node NodeE into which the first divided clock CLK_dA may be inputted.

Figure 2:
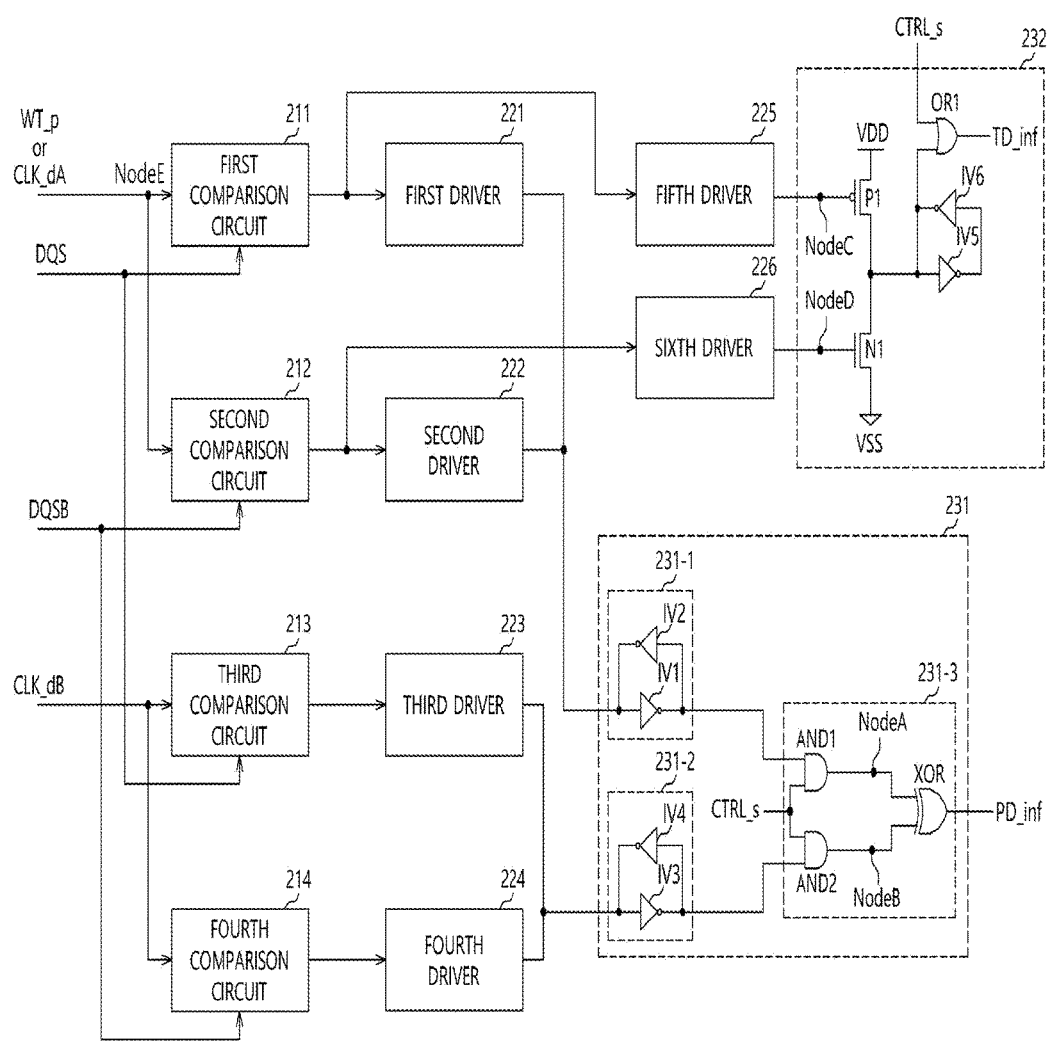
FIG. 2 shows a block diagram illustrating a detection circuit in accordance with an embodiment of the present teachings.

FIG. 2 shows a block diagram illustrating the detection circuit 200 of FIG. 1 in greater detail.

Referring to FIG. 2, the detection circuit 200 may include: first 211, second 212, third 213, and fourth 214 comparison circuits; first 221, second 222, third 223, fourth 224, fifth 225, and sixth 226 drivers; a phase information signal generation circuit 231; and a timing information signal generation circuit 232.

The first comparison circuit 211 may compare the phase of the first divided clock CLK_dA with the phase of the first data determination signal DQS. For example, the first comparison circuit 211 may output a level of the first divided clock CLK_dA as a phase comparison result at a rising edge or a falling edge of the first data determination signal DQS. Particularly, the first comparison circuit 211 may output the level of the first divided clock CLK_dA as the phase comparison result at the rising edge of the first data determination signal DQS. Alternately, the first comparison circuit 211 may receive the write pulse WT_p in place of the first divided clock CLK_dA. In such case, the first comparison circuit 211 may output a level of the write pulse WT_p as the phase comparison result at the rising edge or the falling edge of the first data determination signal DQS.

The second comparison circuit 212 may compare the phase of the first divided clock CLK_dA with the phase of the second data determination signal DQSB. For example, the second comparison circuit 212 may output a level of the first divided clock CLK_dA as a phase comparison result at a rising edge or a falling edge of the second data determination signal DQSB. Particularly, the second comparison circuit 212 may output the level of the first divided clock CLK_dA as the phase comparison result at the rising edge of the second data determination signal DQSB. Alternately, the second comparison circuit 212 may receive the write pulse WT_p in place of the first divided clock CLK_dA. In such case, the second comparison circuit 212 may output a level of the write pulse WT_p as the phase comparison result at the rising edge or the falling edge of the first data determination signal DQS.

The third comparison circuit 213 may compare the phase of the second divided clock CLK_dB with the phase of the first data determination signal DQS. For example, the third comparison circuit 213 may output a level of the second divided clock CLK_dB as a phase comparison result at a rising edge or a falling edge of the first data determination signal DQS. Particularly, the third comparison circuit 213 may output the level of the second divided clock CLK_dB as the phase comparison result at the rising edge of the first data determination signal DQS.

The fourth comparison circuit 214 may compare the phase of the second divided clock CLK_dB with the phase of the second data determination signal DQSB. For example, the fourth comparison circuit 214 may output a level of the second divided clock CLK_dB as a phase comparison result at a rising edge or a falling edge of the second data determination signal DQSB. Particularly, the fourth comparison circuit 214 may output the level of the second divided clock CLK_dB as the phase comparison result at the rising edge of the second data determination signal DQSB.

Each of the first to fourth comparison circuits 211, 212, 213, and 214 may output the level of a divided clock as the phase comparison result at the rising edge of a data determination signal. When the comparison circuit outputs a high level as the phase comparison result, the phase of the divided clock may be ahead of the phase of the data determination signal because the rising edge of the divided clock may be ahead of the rising edge of the data determination signal. When the comparison circuit outputs a low level as the phase comparison result, the phase of the divided clock may be behind the phase of the data determination signal because the rising edge of the divided clock may be behind the rising edge of the data determination signal.

In some embodiments, the first to fourth comparison circuits 211, 212, 213, and 214 may include flip-flops.

The first driver 221 may invert and drive the output of the first comparison circuit 211. The first driver 221 may transmit the driven output to the phase information signal generation circuit 231.

The second driver 222 may invert and drive the output of the second comparison circuit 212. The second driver 222 may transmit the driven output to the phase information signal generation circuit 231.

The third driver 223 may invert and drive the output of the third comparison circuit 213. The third driver 223 may transmit the driven output to the phase information signal generation circuit 231.

The fourth driver 224 may invert and drive the output of the fourth comparison circuit 214. The fourth driver 224 may transmit is the driven output to the phase information signal generation circuit 231.

The fifth driver 225 may invert and drive the output of the first comparison circuit 211. The fifth driver 225 may transmit the driven output to the timing information signal generation circuit 232.

The sixth driver 226 may invert and drive the output of the second comparison circuit 212. The sixth driver 226 may transmit the driven output to the timing information signal generation circuit 232.

When the control signal CTRL_s is enabled, the phase information signal generation circuit 231 may generate the phase information signal PD_inf based on the output signals of the first to fourth drivers 221, 222, 223, and 224. For example, the phase information signal generation circuit 231 may determine whether levels of the output signals from the first and second drivers 221 and 222 are or are not substantially the same as levels of the output signals from the third and fourth drivers 223 and 224. The phase information signal generation circuit 231 may output the determination results via the phase information signal PD_inf.

The phase information signal generation circuit 231 may include a first latch circuit 231-1, a second latch circuit 231-2, and a phase information determination circuit 231-3.

The first latch circuit 231-1 may latch the outputs of the first and second drivers 221 and 222.

The first latch circuit 231-1 may include a first inverter IV1 and a second inverter IV2. An input terminal of the first inverter IV1 may be commonly connected with an output node of the first driver 221 and an output node of the second driver 222. An input terminal of the second inverter IV2 may be connected to an output terminal of the first inverter IV1. An output terminal of the second inverter IV2 may be connected to the input terminal of the first inverter IV1. An output signal of the first latch circuit 231-1 may correspond to an output signal of the first inverter IV1.

The second latch circuit 231-2 may include a third inverter IV3 and a fourth inverter IV4. An input terminal of the third inverter IV3 may be commonly connected with an output node of the third driver 223 and an output node of the fourth driver 224. An input terminal of the fourth inverter IV4 may be connected to an output terminal of the third inverter IV3. An output terminal of the fourth inverter IV4 may be connected to the input terminal of the third inverter IV3. An output signal of the second latch circuit 231-2 may correspond to an output signal of the third inverter IV3.

The phase information determination circuit 231-3 may include a first AND gate AND1, a second AND gate AND2, and an exclusive OR gate XOR. The first AND gate AND1 may receive the output signal of the first latch circuit 231-1 and the control signal CTRL_s. The second AND gate AND2 may receive the output signal of the second latch circuit 231-2 and the control signal CTRL_s. The exclusive OR gate XOR may receive output signals of the first and second AND gates AND1 and AND2 to output the phase information signal PD_inf. A node connected between the exclusive OR gate XOR and the first AND gate AND may correspond to a first node NodeA. A node connected between the exclusive OR gage XOR and the second AND gate AND2 may correspond to a second node NodeB.

When the control signal CTRL_s is disabled, the timing information signal generation circuit 232 may generate the timing information signal TD_inf in response to the output signals of the fifth and sixth drivers 225 and 226. For example, when the fifth driver 225 outputs a signal having a low level, the timing information signal generation circuit 232 may output the timing information signal TD_inf having a high level. When the sixth driver 226 outputs a signal having a high level, the timing information signal generation circuit 232 may output the timing information signal TD_inf having a low level. The output signal of the fifth driver 225 may correspond to a signal generated by inverting the output signal of the first comparison circuit 211. The output signal of the sixth driver 226 may correspond to a signal generated by inverting the output signal of the second comparison circuit 212. Therefore, the level of the timing information signal TD_inf may be determined by the timing information signal generation circuit 232 in accordance with the specific level, i.e., the high level of the output signal from any one of the first and second comparison circuits 211 and 212.

The timing information signal generation circuit 232 may include a first transistor P1, a second transistor N1, a fifth inverter IV5, a sixth inverter IV6, and an OR gate OR1. A gate of the first transistor P1 may receive the output signal of the fifth driver 225. An external voltage VDD may be applied to a source of the first transistor P1. A gate of the second transistor N1 may receive the output signal of the sixth driver 226. A drain of the second transistor N1 may be connected with a drain of the first transistor P1. A source of the second transistor N1 may be connected with a ground terminal VSS. An input terminal of the fifth inverter IV5 may be connected to a node connected with the drains of the first and second transistors P1 and N1. An input terminal of the sixth inverter IV6 may be connected with an output terminal of the fifth inverter IV5. An output terminal of the sixth inverter IV6 may be connected with the input terminal of the fifth inverter IV5. The OR gate OR1 may receive the control signal CTRL_s and an output signal of the sixth inverter IV6 to output the timing information signal TD_inf. A node connected between the fifth driver 225 and the first transistor P1 may correspond to a third node NodeC. A node connected between the sixth driver 226 and the second transistor N1 may correspond to a fourth node NodeD.

Hereinafter, operations of the semiconductor device 60 in accordance with illustrated embodiments are described in detail.

When the control signal CTRL_s is enabled, the divider circuit 100 may divide the external clock CLK_ext to generate the first divided clock CLK_dA and the second divided clock CLK_dB.

The detection circuit 200 may generate the phase information signal PD_inf based on the first data determination signal DQS, the second data determination signal DQSB, the first divided clock CLK_dA, and the second divided clock CLK_dB.

When the levels of the first and second divided clocks CLK_dA and CLK_dB are different from each other, the detection circuit 200 may generate the phase information signal PD_inf enabled to a high level at a rising edge of any one of the first and second data determination signals DQS and DQSB. Further, when the levels of the first and second divided clocks CLK_dA and CLK_dB are substantially same, the detection circuit 200 may generate the phase information signal PD_inf disabled to a low level at a rising edge of any one of the first and second data determination signals DQS and DQSB.

Particularly, referring to FIG. 2, the first comparison circuit 211 may output the level of the first divided clock CLK_dA as an output signal at a rising edge of the first data determination signal DQS.

The second comparison circuit 212 may output the level of the first divided clock CLK_dA as an output signal at a rising edge of the second data determination signal DQSB.

The third comparison circuit 213 may output the level of the second divided clock CLK_dB as an output signal at the rising edge of the first data determination signal DQS.

The fourth comparison circuit 214 may output the level of the second divided clock CLK_dB as an output signal at the rising edge of the second data determination signal DQSB.

The first driver 221 may provide the phase information signal generation circuit 231 with the output signal of the first comparison circuit 211.

The second driver 222 may provide the phase information signal generation circuit 231 with the output signal of the second comparison circuit 212.

The third driver 223 may provide the phase information signal generation circuit 231 with the output signal of the third comparison circuit 213.

The fourth driver 224 may provide the phase information signal generation circuit 231 with the output signal of the fourth comparison circuit 214.

When the control signal CTRL_s is enabled, the phase information signal generation circuit 231 may generate the phase information signal PD_inf based on the output signals of the first through fourth drivers 221, 222, 223, and 224. When the control signal CTRL_s is disabled, the phase information signal generation circuit 231 may fix the phase information signal PD_inf to a specific level, for example, a low level, regardless of the output signals of the first through fourth drivers 221, 222, 223, and 224.

The phase information signal generation circuit 231 may latch the output signals of the first and second drivers 221 and 222 and latch the output signals of the third and fourth drivers 223 and 224. When the control signal CTRL_s is enabled, the phase information signal generation circuit 231 may compare the levels of the latched signals with each other to generate the phase information signal PD_inf. For example, when the level of the signal generated by latching the output signals of the first and second drivers 221 and 222 is different from the level of the signal generated by latching the output signals of the third and fourth drivers 223 and 224, the phase information signal generation circuit 231 may generate the phase information signal PD_inf enabled to the high level. By contrast, when the level of the signal generated by latching the output signals of the first and second drivers 221 and 222 is substantially the same as the level of the signal generated by latching the output signals of the third and fourth drivers 223 and 224, the phase information signal generation circuit 231 may generate the phase information signal PD_inf disabled to the low level. The first and second divided clocks CLK_dA and CLK_dB may be generated by dividing the external clock CLK_ext. For some embodiments, the first and second divided clocks CLK_dA and CLK_dB may have a phase difference of about 90°, as indicated in FIGS. 3 and 4.

Figure 3:
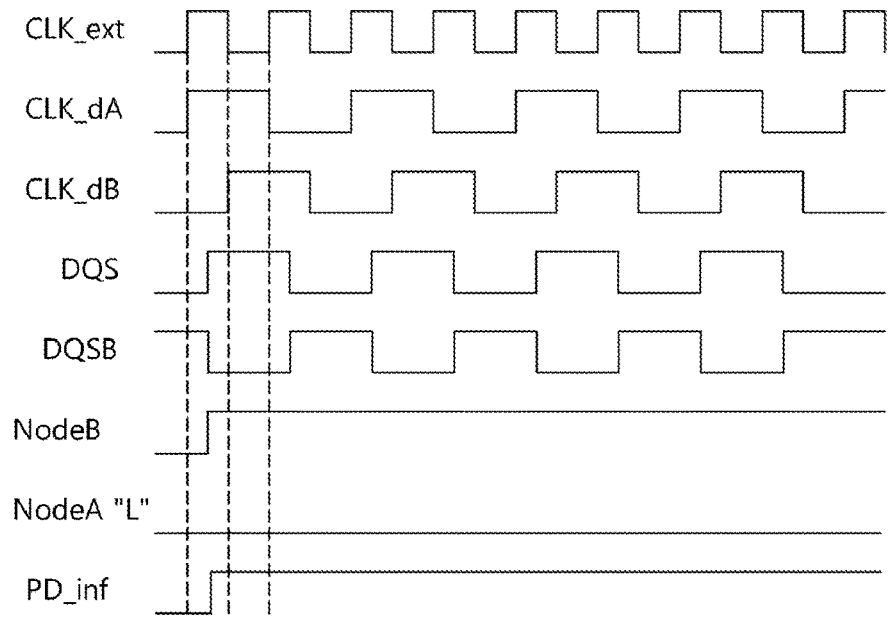
FIG. 3 shows a timing diagram illustrating operations of a semiconductor device in accordance with an embodiment of the present teachings.

Referring to FIG. 3, when the level of the first divided clock CLK_dA is different from the level of the second divided clock CLK_dB (e.g., between the first and second broken vertical lines), the external clock CLK_ext may have a high level. By contrast, when the level of the first divided clock CLK_dA is substantially the same as the level of the second divided clock CLK_dB (e.g., between the second and third broken vertical lines), the external clock CLK_ext may have a low level. By using the above-mentioned characteristics, whether or not the levels of the first and second divided clocks CLK_dA and CLK_dB are the same at the rising edges of the first data determination signal DQS or the second data determination signal DQSB may be determined to ascertain whether or not the phase of the external clock CLK_ext may be ahead of the phase of the first data determination signal DQS or the second data determination signal DQSB.

Particularly, the output signals of the first and second comparison circuits 211 and 212, which may output the level of the first divided clock CLK_dA at the rising edge of the first and second data determination signals DQS and DQSB, may be driven. The output signals of the third and fourth comparison circuits 213 and 214, which may output the level of the second divided clock CLK_dB at the rising edge of the first and second data determination signals DQS and DQSB, may be driven. The driven signals may be transmitted to the phase information signal generation circuit 231. The phase information signal generation circuit 231 may latch the output signals of the first and second driver 221 and 222 via the first latch circuit 231-1 and may latch the output signals of the third and fourth drivers 223 and 224 via the second latch circuit 231-2. The phase information signal generation circuit 231 may generate the phase information signal PD_inf in accordance with the sameness of the levels of the latched signals. When the phase information signal PD_inf has a high level, the phase of the external clock CLK_ext may be ahead of the phases of the first and second data determination signals DQS and DQSB. In contrast, when the phase information signal PD_inf has a low level, the phase of the external clock CLK_ext may be behind the phases of the first and second data determination signals DQS and DQSB.

Figure 4:
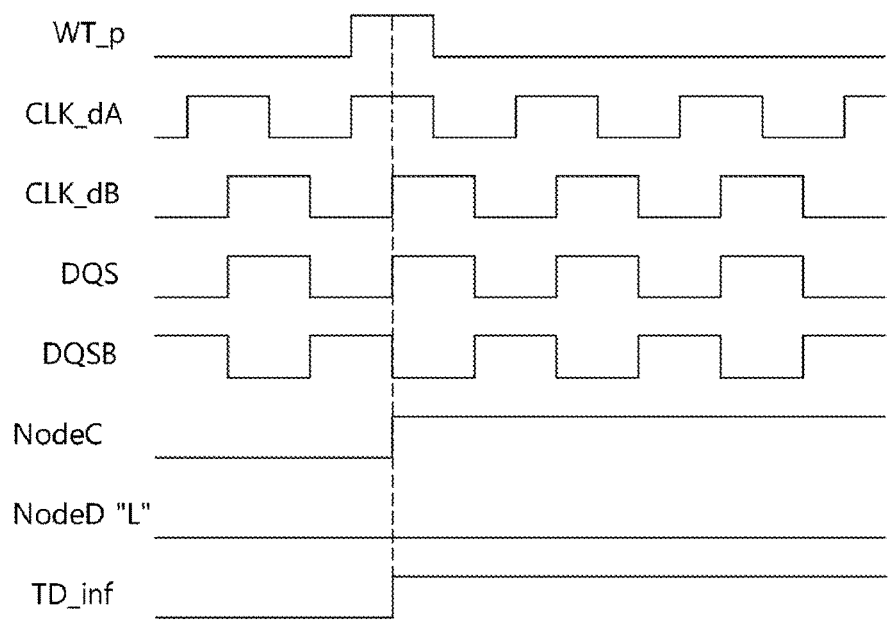
FIG. 4 shows a timing diagram illustrating operations of a semiconductor device in accordance with an embodiment of the present teachings.

Referring to FIG. 4, when the control signal CTRL_s is disabled, the phase information signal PD_inf may be fixed to a specific level, for example, the low level. The timing information signal TD_inf may be generated based on the write pulse WT_p and the first and second data determination signals DQS and DQSB. The write pulse WT_p, for example, is received by the first 211 and second 212 comparison circuits through the same node NodeE by which the divided clock CLK_dA is received when the control signal CTRL_s is enabled.

The first comparison circuit 211 may output a signal level of the write pulse WT_p at a time corresponding to the rising edge of the first data determination signal DQS.

The second comparison circuit 212 may output a signal level of the write pulse WT_p at a time corresponding to the rising edge of the second data determination signal DQSB.

The fifth driver 225 may invert and drive the output signal of the first comparison circuit 211. The fifth driver 225 may then transmit the driven signal to the timing information signal generation circuit 232.

The sixth driver 226 may drive the output signal of the second comparison circuit 212. The sixth driver 226 may then transmit the driven signal to the timing information signal generation circuit 232.

The timing information signal generation circuit 232 may include the first transistor P1 and the second transistor N1. The output signal of the fifth driver 225 may be inputted into the gate of the first transistor P1. The output signal of the sixth driver 226 may be inputted into the gate of the second transistor N1.

When a low-level signal is inputted into the gate of the first (e.g., PMOS) transistor P1, a high-level (e.g., corresponding to the external voltage VDD) timing information signal TD_inf may be outputted. In contrast, when a high-level signal is inputted into the gate of the second (e.g., NMOS) transistor N1, a low-level (e.g., corresponding to the ground terminal VSS voltage) timing information signal TD_inf may be outputted.

Particularly, the first and second comparison circuits 211 and 212 may sample the write pulse WT_p at the rising edges of the first and second data determination signals DQS and DQSB, respectively. When a sampled value is valid, for example, a high level, the fifth driver 225 may invert the output signal of the first comparison circuit 211 to output the low level of the signal. Further, the sixth driver 226 may drive the inverted output signal of the second comparison circuit 212 to output the high level of the signal.

Thus, whether or not the rising edge of any one of the first and second data determination signals DQS and DQSB is overlapped with the high level section of the write pulse WT_p may be determined from the timing information signal TD_inf.

According to some embodiments, when a signal may be synchronized with the external clock CLK_ext and the synchronized signal may be inputted into the semiconductor device 60, the semiconductor device 60 may generate the data determination signal for determining the input signal and the phase information signal including the phase difference information of the external clock. Further, when the semiconductor device 60 may use a plurality of data determination signals, the semiconductor device 60 may generate the information of the data determination signals for determining the input signals as the timing information signal.

FIG. 5 shows a semiconductor system 80 in accordance with some embodiments of the present teachings. Referring to FIG. 5, the semiconductor system 80 may include a controller 1000 and a semiconductor device 2000. As illustrated, the semiconductor device 2000 includes the divider circuit 100 and the detection circuit 200 shown in FIG. 1. For an embodiment, the semiconductor device 2000 represents the semiconductor device 60 shown in FIG. 1.

The controller 1000 may transmit/receive signals to/from the semiconductor device 2000. For example, the controller 1000 may transmit/receive data DQ to/from the semiconductor device 200. The controller 1000 may receive and transmit a data determination signal DQS, a command CMD, and an external clock CLK_ext.

The semiconductor device 2000 may include a transmitting circuit 10, first 21, second 22, third 23, and fourth 24 receiving circuits, first 31 and second 32 buffers, a write pulse generation circuit 33, the divider circuit 100, a delay circuit 34, a data sort circuit 41, the detection circuit 200, a multiplexer 42, and a set storage circuit 50.

The transmitting circuit 10 may transmit output data Data_out and the phase information signal PD_inf as the data DQ to the controller 1000.

The first receiving circuit 21 may receive data DQ from the controller 1000 based on the data determination signal DQS.

The second receiving circuit 22 may receive the data determination signal DQS from the controller 1000. The second receiving circuit 22 may transmit the data determination signal DQS to the first receiving circuit 1.

The third receiving circuit 23 may receive the command CMD from the controller 1000.

The fourth receiving circuit 24 may receive the external clock CLK_ext from the controller 1000.

The first buffer 31 may receive and buffer an output signal of the first receiving circuit 21. The first buffer 31 may transmit the buffered signal to the data sort circuit 41. For example, the first buffer 31 may buffer the data DQ inputted from the first receiving circuit 21. The first buffer 31 may then transmit the buffered data DQ to the data sort circuit 41.

The second buffer 32 may receive and buffer an output signal of the second receiving circuit 22. The second buffer 32 may transmit the buffered signal to the detection circuit 200. For example, the second buffer 32 may buffer the data determination signal DQS inputted from the second receiving circuit 22. The second buffer 32 may then transmit the buffered data DQ to the detection circuit 200. The signal buffered and transmitted by the second buffer 32 may include the first data determination signal DQS and the second data determination signal DQSB indicated in FIG. 2. The phase of the first data determination signal DQS may be opposite to the phase of the second data determination signal DQSB.

The write pulse generation circuit 33 may generate the write pulse WT_p in response to the output signals of the third receiving circuit 23 and the divider circuit 100. For example, when the command CMD inputted from the third receiving circuit 23 is a write command, the write pulse generation circuit 33 may generate the write command WT_p synchronized with the output signal of the divider circuit 100.

The divider circuit 100 may divide the output signal of the fourth receiving circuit 24 to output a divided clock CLK_d. The divided clock CLK_d may include the first divided clock CLK_dA and the second divided clock CLK_dB indicated in FIG. 2. The first and second divided clocks CLK_dA and CLK_dB may have a phase difference of about 90°.

The delay circuit 34 may delay the output signal of the divider circuit 100, i.e., the divided clock CLK_d. The delay circuit 34 may then transmit the delayed signal to the multiplexer 42. The delay circuit 34 may have a delay time corresponding to a time for generating the write pulse WT_p by the write pulse generation circuit 33.

The data sort circuit 41 may sort the output signal of the first buffer 31, i.e., the data DQ in response to the timing information signal TD_inf. The data sort circuit 41 may then output the sorted data as input data Data_in. For example, the data sort circuit 41 may change a sort order of the data DQ transmitted from the controller 1000 in response to the timing information signal TD_inf. The data sort circuit 41 may then output the sorted data as the input data Data_in.

The detection circuit 200 may compare the phases of the divided clock CLK_d transmitted from the multiplexer 42 with the phase of the data determination signal DQS transmitted from the second buffer 32. The detection circuit 200 may transmit the information including the phase differences between the divided clock CLK_d and the data determination signal DQS as the phase information signal PD_inf to the first receiving circuit 10. The detection circuit 200 may transmit, to the data sort circuit 41, the information including whether the write pulse WT_p may be synchronized with the rising edge or the falling edge of the data determination signal DQS as the timing information signal TD_inf in response to the control signal CTRL_s. For example, when the control signal CTRL_s is enabled, the detection circuit 200 may generate the phase information signal PD_inf in response to the divided clock CLK_d and the data determination signal DQS. In contrast, when the control signal CTRL_s is disabled, the detection circuit 200 may generate the timing information signal TD_inf in response to the write pulse WT_p and the data determination signal DQS.

The multiplexer 42 may transmit the write pulse WT_p and the output signal of the delay circuit 34, i.e., any one of the divided clocks CLK_d, to the detection circuit 200. For example, when the control signal CTRL_s is enabled, the multiplexer 42 may transmit the divided clock CLK_d to the detection circuit 200. In contrast, when the control signal CTRL_s is disabled, the multiplexer 42 may transmit the write pulse WT_p to the detection circuit 200.

The set storage circuit 50 may set the enabling of the control signal CTRL_s in response to the command CMD transmitted from the controller 1000. The set storage circuit 50 may output the enabled control signal CTRL_s. The set storage circuit 50 may include a storage circuit for storing environments of the semiconductor device 2000. The set storage circuit 50 may include a mode register set.

The divider circuit 100 is the same as or may include substantially the same elements as the divider circuit 100 described with reference to FIG. 1. Additionally, the detection circuit 200 is the same as or may include substantially the same elements as the detection circuit 200 described with reference to FIGS. 1 and 2. Thus, any further illustrations with respect to the divider circuit 100 and the detection circuit 200 are omitted herein for brevity.

Hereinafter, operations of the semiconductor system are described in detail.

The controller 1000 may generate signals such as the data DQ, the data determination signal DQS, the command CMD, etc., based on the external clock CLK_ext. The controller 1000 may transmit these signals and the external clock CLK_ext to the semiconductor device 2000.

The semiconductor device 2000 may receive the data DQ in response to the data determination signal DQS. The semiconductor device 2000 may receive signals including the command CMD in response to the external clock CLK_ext.

The controller 1000 and the semiconductor device 2000 may perform a training operation before performing a normal operation in which the signals may be transmitted between the controller 1000 and the semiconductor device 2000.

The training operation may include coinciding the phases of the data determination signal DQS and the external clock CLK_ext, which may be transmitted from the controller 1000 to the semiconductor device 2000, with each other.

The controller 1000 may transmit the command CMD to the semiconductor device 2000. The controller 1000 may store the information for enabling the control signal CTRL_s in the set storage circuit 50 for setting the operational environments of the semiconductor device 2000. The controller 1000 may control the set storage circuit 50 for outputting the enabled control signal CTRL_s using the command CMD.

The controller 1000 may transmit the external clock CLK_ext and the data determination signal DQS to the semiconductor device 2000.

The data determination signal DQS transmitted from the controller 1000 may be inputted into the detection circuit 200 through the second receiving circuit 22 and the second buffer 32.

The external clock CLK_ext transmitted by the controller 1000 may be transmitted to the divider circuit 100 through the fourth receiving circuit 24.

The divider circuit 100 may divide the external clock CLK_ext to generate the divided clock CLK_d. The divided clock CLK_d may be transmitted to the multiplexer 42 through the delay circuit 34.

When the control signal CTRL_s is enabled, the detection circuit 200 may compare the phases of the output signals from the second buffer 32 and the multiplexer 42 with each other. The detection circuit 200 may transmit the phase comparison results included in the phase information signal PD_inf to the transmitting to circuit 10. That is, when the control signal CTRL_s is enabled, the detection circuit 200 may transmit the phase comparison results obtained by comparing the phases of the second buffer 32 and the multiplexer 42 output signals with each other as the phase information signal PD_inf to the transmitting circuit 10. The phase information signal PD_inf may include the information of the phase difference between the output signals of the second buffer 32 and the multiplexer 42. The information of the phase difference may include any one of the output signals of the second buffer 32 and the multiplexer 42 being advanced or faster as compared to the other.

The receiving circuit 10 may transmit the phase information signal PD_inf as the data DQ to the controller 1000.

The controller 1000 may control the timing of the data determination signal DQS and the external clock CLK_ext in response to the data DQ, which includes the phase information signal PD_inf. For example, when the phase of the external clock CLK_ext is faster than the phase of the data determination signal DQS based on the phase information signal PD_inf, the controller 100 may delay the output timing of the external clock CLK_ext or advance the output timing of the data determination signal DQS. In contrast, when the phase of the external clock CLK_ext is slower than the phase of the data determination signal DQS based on the phase information signal PD_inf, the controller 100 may advance the output timing of the external clock CLK_ext or delay the output timing of the data determination signal DQS.

The controller 1000 and the semiconductor device 2000 may repeat the above-described operations to synchronize the phases of the data determination signal DQS and the external clock CLK_ext inputted into the semiconductor device 2000 with each other.

When the phases of the data determination signal DQS and the external clock CLK_ext are synchronized, the controller 1000 may disable the enabled control signal CTRL_s outputted from the set storage circuit 50 via the command CMD. The set storage circuit 50 may then output the disabled control signal CTRL_s.

The controller 1000 may transmit the data DQ, the data determination signal DQS, the command CMD, and the external clock CLK_ext.

The data DQ inputted into the semiconductor device 2000 may be transmitted to the data sort circuit 41 through the first receiving circuit 21 and the first buffer 31.

The data determination signal DQS inputted into the semiconductor device 2000 may be transmitted to the detection circuit 200 through the second receiving circuit 22 and the second buffer 32.

When the command CMD inputted into the semiconductor device 200 is a write command, the command CMD as the write pulse WT_p may be transmitted to the multiplexer 42 through the third receiving circuit 23 and the write pulse generation circuit 33. The external clock CLK_ext may be transmitted to the divider circuit 100 through the fourth receiving circuit 24. The divider circuit 100 may divide the external clock CLK_ext to generate the divided clock CLK_d. The divider circuit 100 may transmit the divided clock CLK_d to the write pulse generation circuit 33.

When the control signal CTRL_s is disabled, the multiplexer 42 may transmit the output signal of the write pulse generation circuit 33, i.e., the write pulse WT_p to the detection circuit 200.

The detection circuit 200 may determine whether the write pulse WT_p may be synchronized with the rising edge or the falling edge of the data determination signal DQS. The detection circuit 200 may transmit the determination results, included in the timing information signal TD_inf, to the data sort circuit 41. The detection circuit 200 may output the information as the timing information signal TD_inf including whether the write pulse WT_p may be synchronized with the first data determination signal DQS or the second data determination signal DQSB described with reference to FIGS. 1 and 2. Thus, because the phases of the first and second data determination signals DQS and DQSB may be opposite to each other, synchronizing the write pulse WT_p with the first data determination signal DQS may correspond to synchronizing the write pulse WT_p with the rising edge of the data determination signal DQS. In contrast, synchronizing the write pulse WT_p with the second data determination signal DQSB may correspond to synchronizing the write pulse WT_p with the falling edge of the data determination signal DQS.

The data sort circuit 41 may sort the output signals of the first buffer 31 in response to the timing information signal TD_inf outputted from the detection circuit 200. The data sort circuit 41 may output the sorted signals as the input data Data_in into the semiconductor device 2000. For example, the data sort circuit 41 may sort the output signals of the first buffer 31 in response to the timing information signal TD_inf at the rising edge or the falling edge of the data determination signal DQS. The data sort circuit 41 may output the sorted signals as the input data Data_in.

According to presented embodiments, the semiconductor system 80 including the semiconductor device 2000 may compare the phases of the data determination signal DQS and the external clock CLK_ext with each other to generate the phase information signal PD_inf. The semiconductor system 80 may compare the phases of the data determination signal DQS and the write pulse WT_p to determine whether the data DQ inputted into the semiconductor device 2000 may be synchronized with the rising edges or the falling edges of the data determination signal DQS. The semiconductor system 80 may provide the data sort circuit 41 with the determination results included in the timing information signal TD_inf.

Presented embodiments of the present teachings are intended to be illustrative and not limiting. Various alternative and functionally similar embodiments are possible. The present teachings are not limited by the embodiments described herein. Nor are the present teachings limited to any specific type of semiconductor device. Possible additions, subtractions, or modifications to presented to embodiments falling within the scope of the appended claims will be understood by those of skill in the art.

What is claimed is:

1. A semiconductor device comprising:
a divider circuit for dividing an external clock to generate a plurality of divided clocks; and
a detection circuit for receiving a control signal, a plurality of data determination signals, and the plurality of divided clocks, and generating a phase information signal and a timing information signal based on the control signal, the plurality of data determination signals, and the plurality of divided clocks.

2. The semiconductor device of claim 1, wherein generating the phase information signal comprises generating the phase information signal to include information regarding a phase difference between the external clock and the plurality of data determination signals, and wherein generating the timing information signal comprises generating the timing information signal to include information regarding any of the plurality of data determination signals used for determining a signal inputted into the semiconductor device.

3. The semiconductor device of claim 1, wherein the detection circuit generates the timing information signal based on the plurality of divided clocks and the plurality of data determination signals when the control signal is disabled, and wherein the detection circuit generates the phase information signal based on the plurality of divided clocks and the plurality of data determination signals when the control signal is enabled.

4. The semiconductor device of claim 3, wherein the detection circuit comprises:
a plurality of comparison circuits for outputting levels of the plurality of divided clocks at a specific timing of the plurality of data determination signals;
a phase information signal generation circuit for generating the phase information signal, based on output signals from the plurality of comparison circuits, when the control signal is enabled; and
a timing information signal generation circuit for generating the timing information signal, based on output signals from a set of comparison circuits from among the plurality of comparison circuits, when the control signal is disabled.

5. The semiconductor device of claim 4, wherein the phase information signal generation circuit is configured to determine whether levels of the output signals from the plurality of comparison circuits are substantially the same in generating the phase information signal.

6. The semiconductor device of claim 4, wherein the timing information signal generation circuit is configured to generate the timing information signal based on levels of the output signals from the set of comparison circuits.

7. A semiconductor device comprising:
a divider circuit for dividing an external clock to generate a first divided clock and a second divided clock; and
a detection circuit for receiving a control signal, a first data determination signal, a second data determination signal, the first divided clock, and the second divided clock, and generating a phase information signal and a timing information signal based on the control signal, the first and second data determination signals, and the first and second divided clocks,
wherein the first divided clock and the second divided clock have a phase difference, and wherein the first data determination signal and the second data determination signal have substantially opposite phases.

8. The semiconductor device of claim 7, wherein the detection circuit generates the phase information signal based on the first and second divided clocks and the first and second data determination signals when the control signal is enabled, and wherein the detection circuit generates the timing information signal in response to the first divided clock and the first and second data determination signals when the control signal is disabled.

9. The semiconductor device of claim 8, wherein the detection circuit comprises:
a first comparison circuit for outputting a level of the first divided clock at a rising edge of the first data determination signal;
a second comparison circuit for outputting a level of the first divided clock at a rising edge of the second data determination signal;
a third comparison circuit for outputting a level of the second divided clock at a rising edge of the first data determination signal;
a fourth comparison circuit for outputting a level of the second divided clock at a rising edge of the second data determination signal;
a phase information signal generation circuit for generating the phase information signal based on output signals from the first, second, third, and fourth comparison circuits when the control signal is enabled; and
a timing information signal generation circuit for generating the timing information signal based on output signals from the first and second comparison circuits when the control signal is disabled.

10. The semiconductor device of claim 9, wherein the first, second, third, and fourth comparison circuits comprise at least one flip-flop.

11. The semiconductor device of claim 9, wherein the phase information signal generation circuit determines whether levels of the output signals from the first, second, third, and fourth comparison circuits are substantially the same to generate the phase information signal.

12. The semiconductor device of claim 11, wherein the phase information signal generation circuit comprises:
  a first latch circuit for latching the output signals from the first and second comparison circuits;
  a second latch circuit for latching the output signals from the third and fourth comparison circuits; and
  a phase information determination circuit for determining whether levels of outputs signals from the first and second latch circuits are substantially the same to generate the phase information signal when the control signal is enabled.

13. The semiconductor device of claim 12, wherein the phase information determination circuit comprises an exclusive OR gate.

14. The semiconductor device of claim 9, wherein the timing information signal generation circuit generates the timing information signal in response to an output signal, among the output signals from the first and second comparison circuits, having a specific level.

15. The semiconductor device of claim 14, wherein the timing information signal generation circuit enables the timing information signal when the output signal from the first comparison circuit has a first level, and wherein the timing information signal generation circuit disables the timing information signal when the output signal from the second comparison circuit has a second level.

16. A semiconductor system comprising:
  a controller for providing a data determination signal, a command, and an external clock; and
  a semiconductor device comprising a detection circuit for performing at least one of comparing phases of the data determination signal and a divided clock, generated from the external clock, with each other to generate a phase information signal and comparing phases of the data determination signal and a write pulse with each other to generate a timing information signal based on a control signal,
  wherein the semiconductor device comprises:
    a divider circuit for dividing the external clock to generate the divided clock;
    a write pulse generation circuit for generating the write pulse based on the command and the divided clock;
    a multiplexer for transmitting any one of the divided clock and the write pulse to the detection circuit based on the control signal; and
    a set storage circuit for generating the control signal based on the command.

17. The semiconductor system of claim 16, wherein the multiplexer transmits the divided clock to the detection circuit when the control signal is enabled, and wherein the multiplexer transmits the write pulse to the detection circuit when the control signal is disabled.

18. The semiconductor system of claim 16, wherein the detection circuits compares the phases of the data determination signal and the divided clock with each other to generate the phase information signal when the control signal is enabled, and the detection circuits compares the phases of the data determination signal and the write pulse with each other to generate the timing information signal when the control signal is disabled.

* * * * *